(12) United States Patent
Hooton et al.

(10) Patent No.: US 12,470,645 B2
(45) Date of Patent: Nov. 11, 2025

(54) ELECTRONIC DEVICE ENCLOSURE HAVING A MOLDED STRUCTURE AND A POROUS METALLIC STRUCTURE

(71) Applicant: Apple Inc., Cupertino, CA (US)

(72) Inventors: Lee E. Hooton, New York, NY (US); Alexander W. Williams, Santa Clara, CA (US)

(73) Assignee: APPLE INC., Cupertino, CA (US)

( * ) Notice: Subject to any disclaimer, the term of this patent is extended or adjusted under 35 U.S.C. 154(b) by 237 days.

(21) Appl. No.: 18/223,337

(22) Filed: Jul. 18, 2023

(65) Prior Publication Data

US 2024/0031460 A1    Jan. 25, 2024

Related U.S. Application Data

(60) Provisional application No. 63/390,961, filed on Jul. 20, 2022.

(51) Int. Cl.
| | |
|---|---|
| *H05K 5/02* | (2006.01) |
| *H04M 1/02* | (2006.01) |
| *H05K 5/03* | (2006.01) |
| *H05K 5/04* | (2006.01) |

(52) U.S. Cl.
CPC ............ *H04M 1/0202* (2013.01); *H05K 5/03* (2013.01); *H05K 5/04* (2013.01)

(58) Field of Classification Search
CPC ...... H05K 5/0017; H05K 5/0217; H05K 5/03; H05K 5/04; G06F 1/1656; G06F 1/1662; G06F 3/016; H04M 1/0202; H04M 1/18; H04M 1/72454; H04M 1/185; H05B 45/00; H01H 2213/01; H01H 2213/016; H01H 13/06; H01H 2223/002; H01H 2223/004

USPC ....... 361/728, 730, 752, 796, 800, 807, 809, 361/810

See application file for complete search history.

(56) References Cited

U.S. PATENT DOCUMENTS

| | | | |
|---|---|---|---|
| 10,688,624 B2 | 6/2020 | Krogdahl et al. | |
| 2006/0257624 A1 | 11/2006 | Naritomi et al. | |
| 2009/0194308 A1* | 8/2009 | Cheng | H05K 5/04 174/50 |
| 2012/0175165 A1* | 7/2012 | Merz | G06F 1/1656 174/50 |
| 2016/0089792 A1 | 3/2016 | Ojalehto et al. | |
| 2017/0346166 A1* | 11/2017 | Jarvis | H01Q 1/2258 |
| 2021/0091472 A1* | 3/2021 | Avser | H01Q 9/0485 |

OTHER PUBLICATIONS

Sun et al., "Current Implementation Status of Cold Spray Technology: A Short Review," J. Therm. Spray Tech., https://doi.org/10.1007/s11666-022-01382-4, 18 pages, published Mar. 30, 2022.

\* cited by examiner

*Primary Examiner* — Hung S. Bui
(74) *Attorney, Agent, or Firm* — Brownstein Hyatt Farber Schreck, LLP

(57) ABSTRACT

Electronic devices are disclosed that include metal members bonded to members including a polymer material via a porous metallic layer. The polymer material may at least partially fill and mechanically interlock with pores of the porous metallic layer to form an interlock region.

20 Claims, 11 Drawing Sheets

ELECTRONIC DEVICE ENCLOSURE HAVING A MOLDED STRUCTURE AND A POROUS METALLIC STRUCTURE

CROSS-REFERENCE TO RELATED APPLICATION(S)

This application is a nonprovisional application of and claims the benefit of U.S. Provisional Patent Application No. 63/390,961, filed Jul. 20, 2022, and titled "Electronic Device Enclosure Having a Molded Structure and a Porous Metallic Structure," the disclosure of which is hereby incorporated herein by reference in its entirety.

FIELD

The described embodiments relate generally to electronic device enclosures that include a molded member that is bonded to one or more metal members of the enclosure via a porous metallic structure. More particularly, the present embodiments relate to an enclosure of an electronic device which includes a metallic structure that defines a porous network and bonds the metal member to a molded member including a polymer material.

BACKGROUND

Electronic devices typically include an enclosure or housing that encloses and protects components of the electronic device. Many traditional housings are constructed using multiple components that may be attached using screws or other fastening components. However, it can be difficult to assemble or seal housings using some traditional construction techniques.

SUMMARY

The disclosure provides electronic devices including metal structures bonded to structures including a polymer material via a porous metallic structure. The electronic device may have an enclosure that includes a metal member or structure bonded to the member or structure including the polymer material. In some cases, the electronic device may have an enclosure that is formed from multiple metal members that are joined to one or more of the members including a polymer material in order to provide electrical functionality to the electronic device. For example, one or more metal members of the enclosure or housing may form a radiating antenna element, a contact terminal, a health sensor, or another type of electrical component for the electronic device.

The structure or member including the polymer material may be dielectric member. In some cases, the structure or member including the polymer material may be a polymer member formed from a polymer material or a polymer composite member formed from a polymer composite material. In some examples, the structure or member including the polymer material is formed at least in part through a molding technique and therefore may be referred to herein as a molded structure or a molded member. The molded structure or member may be a thermoplastic polymer structure or member or a thermoplastic polymer composite structure or member. The structure or member including the polymer material may be a polymer-based structure or member. As an example, the polymer material may make up 50% or more of the structure or member.

The porous metallic structure may define a network of interconnected pores and the polymer material or polymer composite material may at least partially fill these interconnected pores and mechanically interlock with the porous metallic structure. The porous metallic structure may be at least partially filled with the polymer material or polymer composite material during molding of the polymer material or the polymer composite material. The porous metallic structure may have the form of a layer.

At least some of the pores of the porous metallic structure may have an opening size that allows a molten polymer material to flow into the pore network. In some embodiments, the pores are sized to allow a molten thermoplastic polymer material to flow into the pore network during a molding process. In some embodiments, the pores are sized to allow a thermoplastic polymer composite material including molten thermoplastic polymer material to flow into the pore network during the molding process. In some cases, the pore network includes pores having an effective diameter in the range from 20 micrometers to 100 micrometers. The density or porosity of the porous metallic structure may be controlled to promote formation of an interconnected pore network while maintaining structural integrity of the porous metallic structure. For example, the porosity of the metallic structure may range from 30% to 70% by volume.

The porous metallic structure may have a thickness sufficient to accommodate a network of interconnected pores, such as a thickness from 50 micrometers to less than 1 mm. The pore space within the porous metallic structure may be tortuous, so that multiple mechanical interlocks are formed between the metal material defining the pore space and the polymer or polymer composite material. The polymer material may therefore mechanically bond to the porous metallic structure directly rather than through use of an intermediate adhesive material. In some examples, the polymer or polymer composite material extends to a depth equal to the thickness of porous metallic structure, which can further increase the mechanical interlocking between the porous metallic structure and the member including the polymer material.

In some cases, the interlock regions described herein can provide a seal that is impact resistant and resists ingress of water and/or dust. The porous metallic structure may provide a strong mechanical interlock between the metal member and the polymer or polymer composite member even though it includes a significant pore volume. For example, the porous metallic structure may be formed of a metal material that both provides structural integrity to the porous metallic structure and forms a strong bond to the metal member. In some examples, the porous metallic structure is formed by spraying metal particles onto a surface of a metal member. The spraying process, which may be a cold spraying process, may bond the metal particles to the surface of the metal member and also bond adjacent metal particles to each other. The spraying process may be controlled to produce the desired pore size, volume, and network connectivity within the porous metallic structure.

In some cases, the porous metallic structure can provide a substantially uniform interlock region and interlock strength across a surface of one or more metal members. In some examples, a substantially uniform interlock region may be produced even when the composition of the metal member is different from that of the porous metallic structure or when the composition of the surface of the metal member varies.

In embodiments described herein an electronic device includes at least one structure or component comprising a metal member bonded to a member including a polymer material. In some cases, the member including the polymer material is bonded to multiple metal members and can help join these metal members. In other cases, the metal member may define an opening and the member including the polymer material may fill the opening. The structure including the metal member bonded to the member including the polymer material may be an enclosure structure, a housing structure, or any structure of the electronic device that would benefit from strong bonding between a metal member and a member including a polymer material.

In some examples, the electronic device includes a housing, and the metal members are metal housing members that define a portion of the exterior surface of the housing. The member including the polymer material may also be a housing member that defines a portion of the exterior surface of the housing. When the member including the polymer material is a dielectric member, the dielectric member may at least partially electrically isolate the two metal housing members. Some degree of electrical isolation between the two metal housing members can facilitate use of one or both of the metal housing members as an antenna element as described in greater detail with respect to FIGS. 1A and 1B.

The disclosure provides an electronic device comprising a display, an enclosure defining an internal cavity, and a front cover coupled to the housing and defining a transparent window positioned over the display. The enclosure includes a housing comprising a first metal housing member defining a first portion of an exterior surface of the housing, a first metallic coating defining a first pore network and disposed along an interior surface of the first metal housing member, a second metal housing member defining a second portion of the exterior surface of the housing, a second metallic coating defining a second pore network and disposed along an interior surface of the second metal housing member, and a dielectric member defining a third portion of the exterior surface of the housing and extending into pores of the first network and the second pore network.

The disclosure also provides an electronic device comprising an enclosure defining an internal cavity. The enclosure includes a first enclosure structure comprising a first metal enclosure member defining a first portion of an exterior surface of the enclosure and a first metallic coating bonded to an interior surface of the first metal enclosure member and defining a first set of interconnected pores, a second enclosure structure comprising a second metal enclosure member defining a second portion of the exterior surface of the enclosure and a second metallic coating bonded to an interior surface of the second metal enclosure member and defining a second set of interconnected pores, and a dielectric member defining a third portion of the exterior surface of the enclosure and extending into each of the first and the second sets of interconnected pores. The electronic device further includes sensor circuitry positioned within the internal cavity and operatively coupled to the first metal enclosure member.

The disclosure further provides housing for an electronic device, the housing comprising a first housing member formed from a first metal material defining a first portion of an exterior surface of the housing, a second housing member formed from a second metal material defining a second portion of the exterior surface of the housing, a third housing member formed from a polymer-based material defining a third portion of the exterior surface of the housing, a first metallic layer bonded to an interior surface of the first housing member and defining a first pore network, a first portion of the polymer-based material of the third housing member extending into the first pore network; and a second metallic layer bonded to an interior surface of the second housing member and defining a second pore network, a second portion of the polymer-based material of the third housing member extending into the second pore network.

BRIEF DESCRIPTION OF THE DRAWINGS

The disclosure will be readily understood by the following detailed description in conjunction with the accompanying drawings, wherein like reference numerals designate like elements.

Figure 1A:
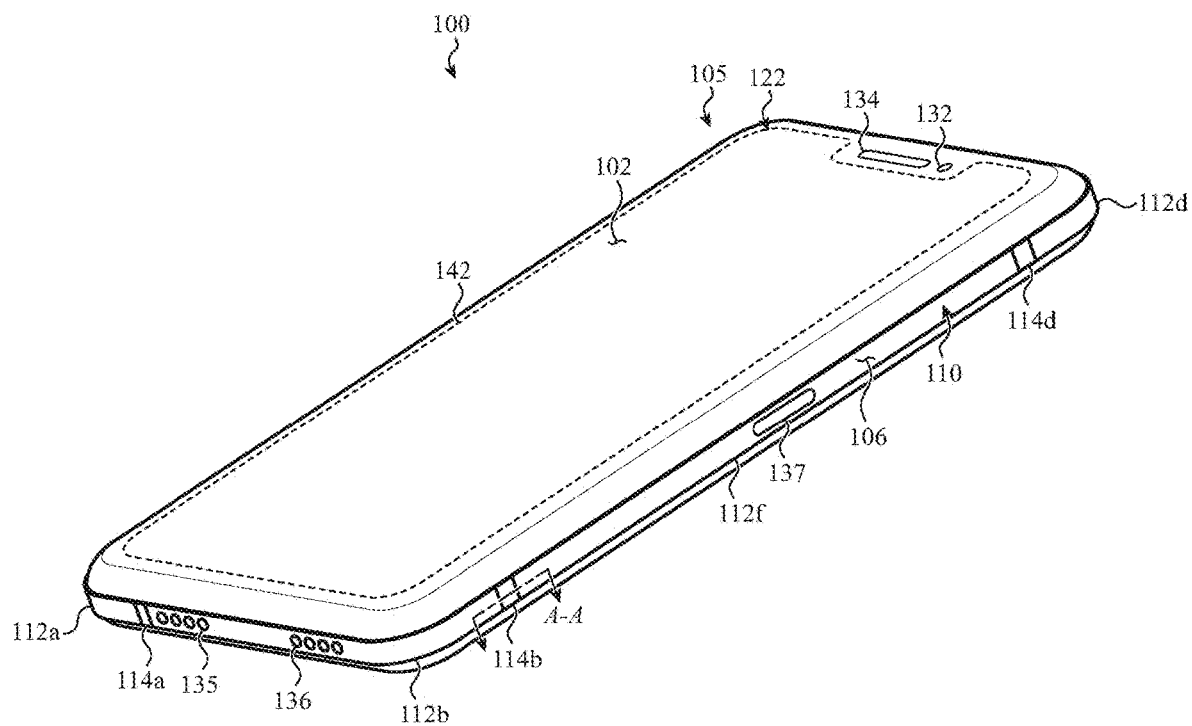
FIG. 1A shows a view of the front of an electronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred implementation. To the contrary, the described embodiments are intended to cover alternatives, modifications, and equivalents as can be included within the spirit and scope of the disclosure and as defined by the appended claims.

Some of the example embodiments and techniques described herein are directed to portable electronic devices that include an enclosure or housing that has a segmented or multi-component structure. As described herein, the housings may include multiple members or structures that are formed from a metal material in order to provide a durable enclosure. In some cases, one or more of the metal housing members also provide electrical functionality to the electronic device and may form a radiating antenna element, a contact terminal (e.g., for a health sensor such as a sensor for obtaining an ecg or another type of sensor), or another type of electrical component for the electronic device. In order to provide this functionality, a metal housing member may be insulated from an adjacent metal housing member, particularly if the adjacent members(s) are also formed from a metal material and/or are conductive. As described herein, an intermediate dielectric member may be positioned between adjacent metal housing members in order to provide some degree of electrical isolation of a respective metal housing member.

While a segmented or multi-component housing may provide functional benefits, structurally joining the various components while providing adequate housing structural integrity may be difficult. The structural joints may need to survive impact and normal or predicted use cases. In some cases, the structural joints may also need to be waterproof, water resistant, or provide another type of seal against ingress of liquid, foreign objects, or debris. The embodiments described herein may be used to address some of the structural joining issues for a multi-component housing involving both metal and non-metal or molded components.

Embodiments of the disclosure are directed to an electronic device that includes metal members or segmented housing structures that are bonded to a member including a polymer material via a porous metallic layer. The metal members may be bonded to members including a polymer material such as polymer members and/or polymer composite members. The members including a polymer material may be formed at least in part through a molding process and in some cases may be polymer-based members as previously discussed. The porous metallic layer may define a network of interconnected pores and the polymer material or polymer composite material may at least partially fill these interconnected pores and mechanically interlock with the porous metallic layer. The porous metallic layer at least partially filled with the polymer material or polymer composite material may define an interlock region of the enclosure.

At least some of the pores of the porous metallic layer may have an opening size that allows a molten polymer material to flow into the pore network. For example, the pores may be sized to allow a molten thermoplastic polymer material or a molten thermoplastic polymer composite material to flow into the pore network during a molding process. The molten thermoplastic polymer composite material may include a molten thermoplastic polymer material, but the composite reinforcement material need not be molten. In some cases, the pore network includes pores having an effective diameter in the range from 20 micrometers to 100 micrometers. The density or porosity of the porous metallic layer may be controlled to promote formation of an interconnected pore network while maintaining structural integrity of the porous metallic layer. For example, the porosity of the metallic layer may range from 30% to 70% or from 40% to 60% by volume. In some cases, the porosity value is an average porosity value.

The porous metallic layer may have a thickness sufficient to accommodate a network of interconnected pores, such as a thickness from 50 micrometers to less than 1 mm. The pore space within the porous metallic layer may be tortuous, so that multiple mechanical interlocks are formed between the metal material defining the pore space and the polymer or polymer composite material. The polymer material may therefore mechanically bond to the porous metallic layer directly rather than through use of an intermediate adhesive material. In some examples, the polymer or polymer composite material extends to a depth equal to the thickness of porous metallic layer, which can further increase the mechanical interlocking between the porous metallic layer and the member including the polymer material.

In some cases, the interlock regions described herein can provide a seal that is impact resistant and resists ingress of water and/or dust. The porous metallic layer may provide a strong mechanical interlock between the metal member and the polymer or polymer composite member even though it includes a significant pore volume. For example, the porous metallic layer may be formed of a metal material that both provides structural integrity to the porous metallic layer and forms a strong bond to the metal member. In some examples, the porous metallic layer is formed by spraying metal particles onto a surface of a metal member. The spraying process, which may be a cold spraying process, may bond the metal particles to the surface of the metal member and also bond adjacent metal particles to each other. The spraying process may be controlled to produce the desired pore size, volume, and network connectivity within the porous metallic layer.

In some cases, the porous metallic layer can provide a substantially uniform interlock region and interlock strength across a surface of one or more metal members. In some examples, a substantially uniform interlock region may be produced even when the composition of the metal member is different from that of the porous metallic layer or when the composition of the surface of the metal member varies.

In embodiments described herein an electronic device includes at least one structure comprising a metal member bonded to a member including a polymer material. In some cases, the member including the polymer material is bonded to multiple metal members and can help join these metal members. In other cases, the metal member may define an opening and the member including the polymer material may fill the opening. The structure including the metal member bonded to the member including the polymer material may be an enclosure structure, a housing structure, or any structure of the electronic device that would benefit from strong bonding between a metal member and a member including a polymer material.

In some examples, the electronic device includes a housing, and the metal members are metal housing members that define a portion of the exterior surface of the housing. The member including the polymer material may also be a housing member that defines a portion of the exterior surface of the housing. When the member including the polymer material is a dielectric member, the dielectric member may at least partially electrically isolate the two metal housing members. Some degree of electrical isolation between the two metal housing members can facilitate use of one or both of the metal housing members as an antenna element as described in greater detail with respect to FIGS. 1A and 1B.

These and other embodiments are discussed below with reference to FIGS. 1A-10. However, those skilled in the art will readily appreciate that the detailed description given herein with respect to these figures is for explanatory purposes only and should not be construed as limiting.

Figure 1B:
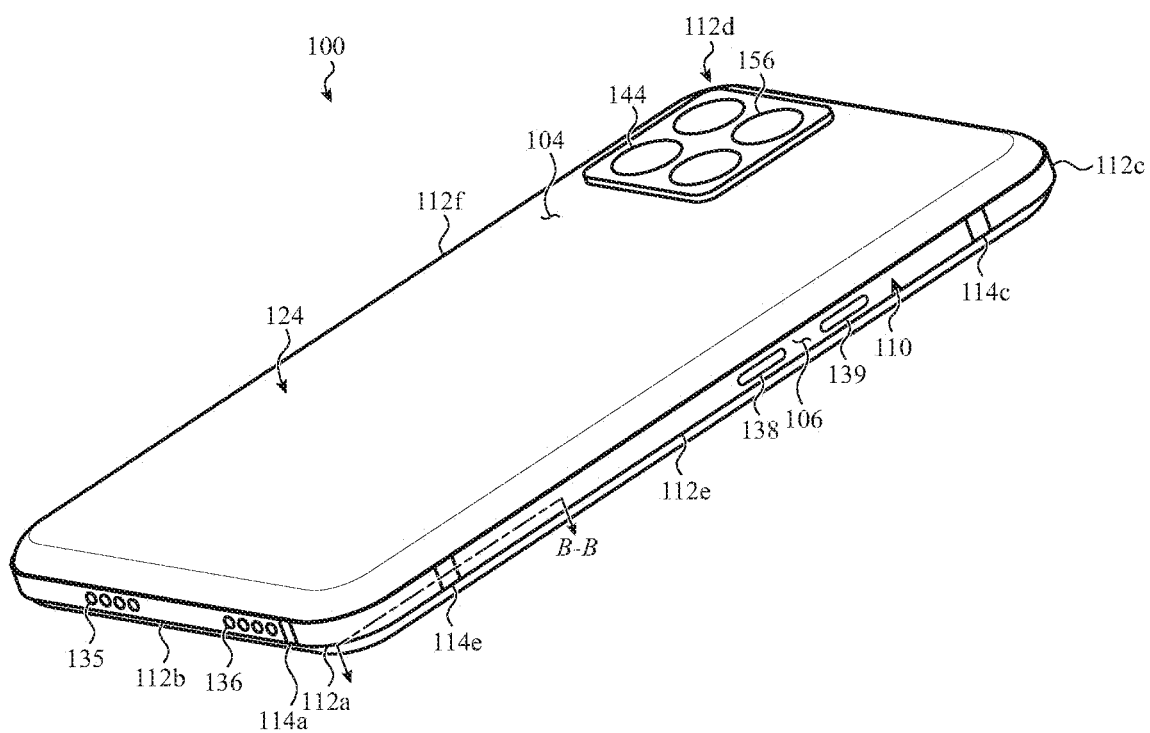
FIG. 1B shows a view of the rear of an electronic device.

FIGS. 1A and 1B show an example of an electronic device or simply "device" 100. FIG. 1A shows a view of the front of the electronic device while FIG. 1B shows a view of the rear of the electronic device. For purposes of this disclosure, the electronic device 100 may be a portable electronic device including, for example a mobile phone, tablet computer, a portable computer, a wearable electronic device, a portable music player, a health monitoring device, a portable terminal, wireless charging device, device accessory, or other portable or mobile device.

In embodiments described herein an electronic device includes at least one structure or component comprising a metal member bonded to a member including a polymer material. The structure or component including the metal member bonded to the member including the polymer material may be an enclosure structure or component, a housing structure or component, or any structure or component of the electronic device that would benefit from strong bonding between a metal member and a member including a polymer material.

In some cases, the member including the polymer material is bonded to multiple metal members and can help join these metal members. In the example of FIGS. 1A and 1B, the electronic device 100 includes a housing structure 110 (i.e., a housing) that includes at least one pair of adjacent metal members bonded to a member including a polymer material, as described in more detail below. In other cases, the member including the polymer material may be bonded to an interior surface of a metal housing structure (e.g., a metal shell) and may be used to join or mount another component to the metal housing structure. In further cases, the metal member defines an opening and the member including the polymer material fills the opening.

The metal member may be bonded to the member including the polymer material via a porous metallic layer. In embodiments, the porous metallic layer defines a network of interconnected pores and the polymer material or polymer composite material at least partially fill these interconnected pores and mechanically interlocks with the porous metallic layer. The porous metallic layer at least partially filled with the polymer material or polymer composite material may define an interlock region of the enclosure. The porous metallic layer may be disposed along a surface of the metal housing member and in some cases may be deposited on the surface and/or partially embedded in the surface. Examples of interlock regions are shown and described in more detail with respect to FIGS. 2 through 7. The description provided with respect to FIGS. 2 through 7 is generally applicable herein and is not repeated here. Examples of porous metallic layers are shown and described in FIGS. 3, 8, and 9.

In the example of FIGS. 1A and 1B, the electronic device 100 includes an enclosure 105 that defines an internal cavity of the electronic device. The internal cavity is shown in the partial cross-sectional views of FIGS. 2 and 4-7 (e.g., cavity 203 in FIG. 2). The enclosure 105 includes a housing 110 and front and rear covers 122 and 124.

The housing 110 of the electronic device 100 includes multiple metal housing members (112a, 112b, 112c, 112d, 112e, and 112f) bonded to one or more housing members including a polymer material. The one or more housing members including a polymer material define multiple spacer elements (114a, 114b, 114c, 114d, and 114e). A spacer element 114f may also be located between the housing members 112c and 112d but is not visible in the views of FIGS. 1A and 1B. In some cases, a housing member formed of a polymer material may define a single spacer element, examples of which are shown in the partial cross-sectional views of FIGS. 2, 5, and 6. In additional cases, a single housing member including a polymer material may define multiple spacer elements, as shown in the example of FIG. 7. The additional description provided with respect to FIGS. 2 through 7 is generally applicable herein.

In the example of FIGS. 1A and 1B, a spacer element is positioned between and bonded to each pair of adjacent metal housing members. For example, the spacer element 114b shown in FIG. 1A is positioned between and bonded to the metal housing members 112b and 112f. Each of the metal housing members (112a, 112b, 112c, 112d, 112e, and 112f) and the spacer elements (114a, 114b, 114c, 114d, and 114e) define a respective portion of an exterior surface of the housing. In the example of FIGS. 1A and 1B, the housing 110 defines a side surface 106 of the electronic device.

One or more of the housing members 112a, 112b, 112c, 112d, 112e, and 112f of FIGS. 1A and 1B may be a conductive housing member. In some cases, each of the housing members 112a through 112f may be electrically conductive (also simply referred to as conductive). In some examples, each of the metal housing members (112a, 112b, 112c, 112d, 112e, and 112f) is formed from a metal material. By the way of example, a housing member formed from a metal material may be formed from one or more of an aluminum alloy, steel, a titanium alloy, a magnesium alloy, or similar materials. The metal housing members 112a, 112b, 112c, 112d, 112e, and 112f may be formed of the same metal material or of different metal materials. In additional examples, some of the housing members 112a, 112b, 112c, 112d, 112e, and 112f are formed of a metal material and others are formed from a material other than a metal material. The shapes of the metal housing members 112a, 112b, 112c, 112d, 112e, and 112f shown in FIGS. 1A and 1B are exemplary rather than limiting and in additional examples the housing members may be assembled to produce a housing that has a different shape, such as a square or round shape, and/or has a different ratio of length/and or width than the electronic device shown in FIGS. 1A and 1B. In some cases, an exterior coating may be formed on one or more metal housing member to impart a particular visual appearance, such as an anodization (metal oxide) layer or a physically vapor deposited coating. The foregoing description of metal housing members is generally applicable herein and is not limited to the example of FIGS. 1A and 1B.

In embodiments, each of the housing members including a polymer material is formed from a polymer material or a polymer composite material including the polymer material. When the polymer material is the predominant component of the housing member, the housing member may be referred herein to as a polymer-based member. For example, the polymer material may make up at least 50% of the housing member. In some examples, the polymer material is a thermoplastic polymer material, such as one or more of a polycarbonate material, an acrylonitrile butadiene styrene (ABS) material, a polyether ether ketone (PEEK) material, a polyaryl ether ketone (PAEK) material, a polybutylene terephthalate (PBT) material, or a polyamide material. In other examples, the polymer material is a thermoset polymer material. The polymer material may also include a coloring agent such as a pigment or a dye to impart a particular visual appearance to the housing member. A housing member including a polymer material may be formed at least in part through a molding process. In some cases, a machining process may follow the molding process to produce the final shape of the housing member.

In some embodiments, the polymer material or the polymer composite used to make the housing member is a dielectric material. In some cases, the dielectric housing member may provide at least some extent of electrical isolation between conducting housing members. For example, the electrical resistivity may be sufficiently high to prevent or substantially limit electrical conduction through the dielectric housing member. For example, the volume electrical resistivity may be at least $1\times10^{10}$ ohm-cm, least $1\times10^{12}$ ohm-cm, or at least $1\times10^{16}$ ohm-cm. Alternately or additionally, the dielectric constant may be sufficiently low to reduce capacitive coupling with an adjacent electrically conductive housing member. As examples, the dielectric constant may be less than 10 and greater than 1, less than 7 and greater than 1, or less than 5 and greater than 1 at a frequency or frequency range of interest (e.g., a frequency in a range from 450 MHz to 75 GHz). In some embodiments, at least one of the electrically conducting housing members is configured to operate as an antenna. For example, at least one of the conducting housing members may be configured to radiate electromagnetic radiation (e.g., radio frequency (RF) signals) for a wireless communication system. The dielectric housing member may electrically isolate this radiating antenna element from an adjacent conducting housing member. In other embodiments, the dielectric housing member may separate different regions of a conducting housing member. For example, a region of a conducting housing member may be configured to operate as a contact terminal for a sensor and the dielectric housing member may separate this region from another region of the sensor. As another example, the dielectric housing member may serve as an RF transmissive window (e.g., for an internal RF antenna or other RF emitter).

A polymer composite material may include a reinforcement material distributed in a matrix of the polymer material. The reinforcement material may be discontinuous fibers, particles, or a combination thereof. In some examples, the discontinuous fibers include one or more of glass fibers (e.g., silicate glass fibers), carbon fibers, or aramid fibers. The reinforcing fibers may have a lateral dimension (e.g., a width or diameter) that ranges from 5 micrometers to micrometers. In some cases, the average lateral dimension of the reinforcing fibers ranges from 5 micrometers to 30 micrometers. When the reinforcing fibers have a generally rectangular cross-sectional shape, the lateral dimension or width of the fiber may refer to the larger dimension of the rectangle. The length of the fibers may be in a range from 100 micrometers to 500 micrometers. In some examples, reinforcing particles may have an average diameter from 5 micrometers to 50 micrometers or an average diameter from 1 micrometer to 25 micrometers. In embodiments, the reinforcing particles are formed from a dielectric material such as a glass material, a ceramic material (e.g., a silicon oxide or an aluminum oxide), or the like. In some examples, the reinforcing fibers or particles may make up at least 20% of the composite material, such as from 20% to 40%, from 20% to 50%, from 30% to 60%, from 30% to 50%, or from 40% to 60%. In some cases, the percentage of fibers or particles is determined on a volume basis while in other cases the percentage is determined on a weight basis. The foregoing description of housing members including a polymer material is generally applicable herein and not limited to the example of FIGS. 1A and 1B.

In embodiments, a porous metallic layer is disposed along a surface of each of a pair of adjacent metal housing members to enhance bonding between the spacer element and the pair of metal housing members. The porous metallic layer may also be referred to herein as a porous metal coating. The pore space within the porous metallic layer may be interconnected to allow flow of a polymer material or a polymer composite material between different regions of the pore space. The porous metallic layer may be deposited along a surface of the metal housing member and in some cases may be at least partially embedded in the surfaces of the metal housing member.

In embodiments, the porous metallic layer is not disposed on an exterior surface of the metal housing member but instead is disposed on an interior surface. In the example of FIGS. 1A and 1B, the porous metallic layer is typically disposed on a surface that extends from the exterior surface towards the interior of the housing; this surface may define an end of the metal housing member. This surface may also be referred to herein as a facing surface since it typically faces another surface of the other metal housing member of the pair of adjacent metal housing members. In some cases, the porous metallic layer may also be disposed on a surface of the metal housing member that is generally opposite the exterior surface of the metal housing member. Examples of porous metallic layers, metal housing members, and housing members are shown and described in more detail with respect to FIGS. 2 through 7. FIGS. 2, 4, 5, and 6 show examples of partial cross-sectional views through the polymer spacer element 114*b* along A-A. FIG. 7 shows an example of a partial cross-section view through the polymer spacer elements 114*a* and 114*e* along B-B.

In embodiments, the porous metallic layer is predominately made up from a metal material. For example, the porous metallic layer may include greater than 90% of the metal material. In some cases, the metal material used to form the porous metallic layer is the same metal material used to form the metal housing members. In other cases, the metal material used to form the porous metallic layer is a different metal material than at least one of the metal materials used to form the metal housing members. In some examples, the different metal materials are based on the same metal element, such as when the metal housing members and the porous metallic layer are each formed of a titanium-based material. A metal material may be based on a metal element when that metal element is the predominant component of the alloy (e.g., the greatest percent by weight, which may be at least 50% by weight). In other examples, the different metal materials are based on different metal elements, such as when the metal housing members include an aluminum alloy layer (e.g., a core layer) and a titanium alloy layer (e.g., a shell layer) and the porous metallic layer is formed from titanium or a titanium alloy. Similarity in chemical composition of the porous metallic layer and the metal housing members can enhance metallurgical bonding between the porous metallic layer and the metal housing members but may not be required if mechanical bonding between the porous metallic layer and the metal housing members is sufficiently strong. The foregoing description of porous metallic layers is generally applicable herein and not limited to the example of FIGS. 1A and 1B.

In some cases, one or more openings may be formed in the housing 110, such as the openings 135 and 136 formed in the component 112*b*. As examples, such an opening may be provided over a speaker or a microphone, may surround a button or other type of input device, or may allow access to a charging port. In the example of FIGS. 1A and 1B, the electronic device 100 includes buttons 137, 138, and 139, which may be used to turn the electronic device on or off, as volume controls, and/or to control other functions of the electronic device.

The housing 110 and the front and rear covers 122 and 124 enclose internal components of the electronic device and may be referred to collectively herein as an enclosure. The front cover 122 and/or the rear cover 124 may define a substantial entirety or substantially all of the front and/or the rear surface of the electronic device. In some cases, the electronic device includes a support plate and/or additional internal structural components that are used to support internal electronic circuitry or electronic components. The example of FIGS. 1A and 1B is not limiting and in other examples internal components of the electronic device may be enclosed by a housing lacking a cover, by a housing in combination with a single cover, or any other suitable configuration.

The front cover 122 may be positioned over a display 142 and may provide a transparent window through which the display may be viewed. In some cases, the display 142 is a touch-sensitive display. The display 142 may be a liquid-crystal display (LCD), a light-emitting diode (LED) display, an LED-backlit LCD display, an organic light-emitting diode (OLED) display, an active layer organic light-emitting diode (AMOLED) display, and the like. In some embodiments, the display 142 may be attached to (or abut) the front cover 122. The front cover 122 may at least partially define a front surface 102 of the electronic device. An opening 134 may be provided in the front cover 122 and in some cases may provide a speaker port. The electronic device 100 may also include a front-facing camera 132.

The exterior surface of the rear cover 124 may at least partially define a rear surface 104 of the electronic device. In the example of FIG. 1B, the rear cover 124 includes a thicker region 144 which accommodates one or more optical modules 156 of a camera assembly. The thicker region 144 may be integrally formed with the surrounding portion of the rear cover or may be provided by a separate cover piece which is coupled to the surrounding portion of the rear cover (e.g., by a coupling ring).

The electronic device 100 further includes a camera assembly which in turn includes the one or more optical modules 156. The camera assembly may define any number of optical modules such as one, two, three, four, five, or six optical modules. The optical modules may include, but are not limited to, a camera module, an illumination module, a sensor, and combinations thereof. When the camera assembly includes multiple camera modules, each of the camera modules may have a different field of view or other optical property. A grouping of camera modules may be referred to herein as a camera array. In some cases, a camera module includes an optical sensor array and/or an optical component such as a lens, filter, or window. In additional cases, a camera module includes an optical sensor array, an optical component, and a camera module housing surrounding the optical sensor array and the optical components. The camera module may also include a focusing assembly. For example, a focusing assembly may include an actuator for moving a lens of the camera module. In some cases, the optical sensor array may be a complementary metal-oxide semiconductor (CMOS) array or the like. In some cases, the camera assembly may include one or more sensors such as a depth measuring sensor (e.g., a time-of-flight sensor), an ambient light sensor, an infrared sensor, an ultraviolet light sensor, a health monitoring sensor, a biometric sensor (e.g., a fingerprint sensor) or the like.

Typical front and rear covers can include a cover member that is less than 5 mm in thickness. As examples, the cover member may be from 200 micrometers to less than 3 mm in thickness, from 200 micrometers to less than or equal to 2 mm in thickness, or from 200 micrometers to less than or equal to 1 mm in thickness. The front cover 122 and the rear cover 124 may be coupled to the housing 110. For example, each of the front cover 122 and the rear cover 124 may be coupled to the housing with an adhesive, a fastener, an engagement feature, or a combination thereof.

Each of the front cover 122 and the rear cover 124 typically includes a cover member which may be a glass member, a glass ceramic member, or a member comprising one or more glass portions and one or more glass ceramic portions. The cover member may be chemically strengthened by ion exchange. In some cases, a cover may include multiple layers, each layer selected from a glass layer, a glass ceramic layer, and a polymer layer. A cover such as the front cover 122 and the rear cover 124 may further include one or more coatings. For example, the cover may include an exterior coating such as an oleophobic coating and/or an anti-reflective coating. Alternately or additionally, the cover may also include an interior coating such as a masking layer or a multilayer coating including at least one-color layer.

Figure 10:
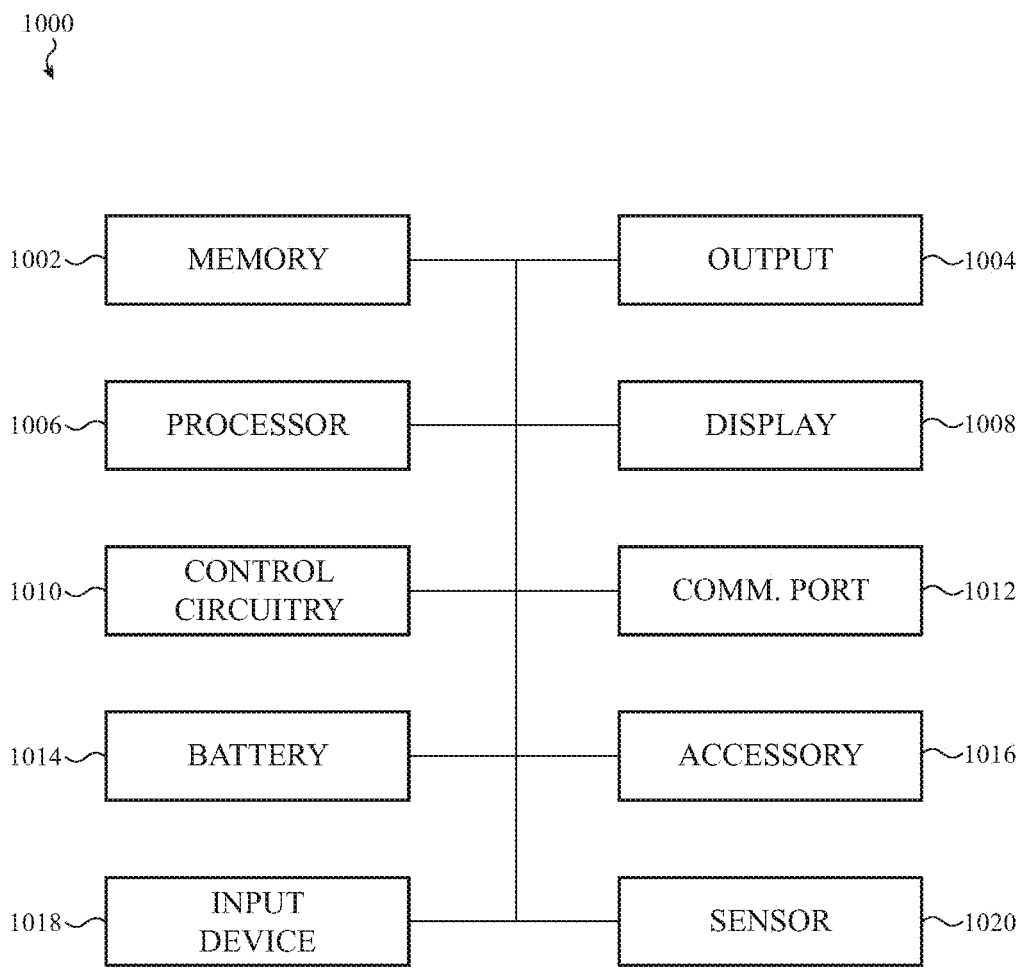
FIG. 10 shows a block diagram of an example electronic device.

In addition to a display and a camera assembly, the electronic device 100 may include additional components. These additional components may comprise one or more of a processing unit, control circuitry, memory, an input/output device, a power source (e.g., battery), a charging component or assembly (e.g., a wireless charging component), a network communication interface, an accessory, wireless communication circuitry (e.g., antenna circuitry), or circuitry and/or other components of a sensor. In some embodiments, wireless communication circuitry or sensor circuitry is positioned with an internal cavity of the electronic device 100 and operatively coupled to one or more of the metal or conductive enclosure members. The metal or conductive enclosure member may form a radiating antenna element when coupled to antenna circuitry or a contact terminal for a sensor when coupled to sensor circuitry. Components of a sample electronic device are discussed in more detail below with respect to FIG. 10 and the description provided with respect to FIG. 10 is generally applicable herein.

Figure 2:
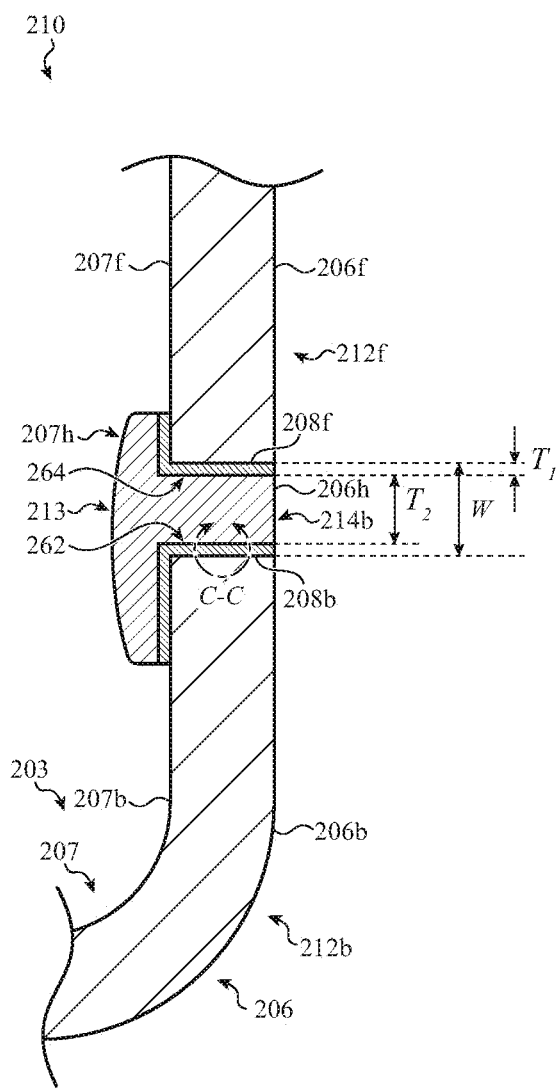
FIG. 2 shows a partial cross-sectional view of an electronic device housing.

FIG. 2 shows a partial cross-sectional view of an electronic device housing 210. The housing 210 may be an example of the housing 110 of FIGS. 1A and 1B and the cross-section through the housing 210 may be an example of a lateral cross-section through the housing 110 along A-A in FIG. 1A. The housing partially defines an internal cavity 203 of the electronic device.

The housing 210 includes two metal housing members 212b and 212f and another housing member 213 that includes a polymer material. As previously discussed, the housing member 213 may be formed of a polymer material or a polymer composite material and in some cases may be a dielectric housing member. The housing member 213 defines a spacer element 214b that is positioned between the metal housing members 212b and 212f. The housing 210 also includes interlock regions 262 and 264. Each of the interlock regions 262 and 264 includes a porous metallic layer and portions of the spacer element that extend into pores of the porous metallic layer, as shown in the detail view of FIG. 3. In the example of FIG. 2, another portion of the spacer element 214b is positioned between the interlock regions 262 and 264 and this portion may have thickness $T_2$. As shown in the example of FIG. 2, the interlock regions 262 and 264 each have thickness $T_1$. The thickness $T_1$ may be similar to the porous metallic layer thicknesses described with respect to FIG. 3 and that description is not repeated here.

The housing 210 defines exterior and interior surfaces and each of the housing members 212b, 212f, and 213 define portions of these exterior and interior surfaces. For example, the housing 210 defines the exterior surface 206, the housing member 212b defines the exterior surface portion 206b, the spacer element 214b of the housing member 213 defines the exterior surface portion 206h, and the housing member 212f defines the exterior surface portion 206f. The housing 210 also defines the interior surface 207, the housing member 212b defines interior surface portion 207b, the housing member 213 defines the interior surface portion 207h, and the housing member 212f defines the interior surface portion 207f. The interior surface portion 207b may be generally opposite the exterior surface portion 206b and the interior surface portion 207f may be generally opposite the exterior surface portion 206f.

Figure 3:
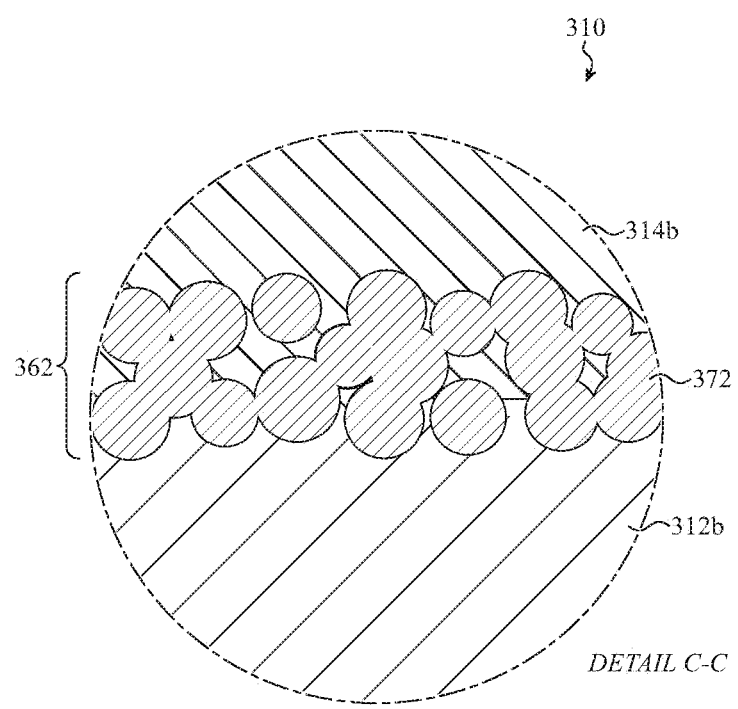
FIG. 3 shows an enlarged cross-sectional view of an electronic device housing.

The housing members 212b and 212f also respectively define the interior surface portions 208b and 208f. The interior surface portion 208b extends inward from the exterior surface portion 206b and the interior surface portion 208f extends inward from the exterior surface portion 206f. The interlock region 262 may be located along the interior surface portion 208b and the interlock region 264 may be located along the interior surface portion 208f. In some cases, the porous metallic layer of the interlock region 262 may be partially embedded into the housing member 212b, as shown in the example of FIG. 3. Alternately or additionally, the porous metallic layer of the interlock region may be partially embedded into the housing member 212f in a similar fashion as shown in the example of FIG. 3. As a result, the interior surface portions 208b and 208f may be non-planar once the porous metallic layers of the interlock regions 262 and 264 are disposed thereon, as schematically illustrated in FIG. 3. The interior surface portions 208b and 208f may be spaced apart by a gap, W, which in some cases may range from about 500 micrometers to about 2 mm, from about 500 micrometers to about 1.5 mm or from about 750 micrometers to about 1.2 mm.

Figure 5:
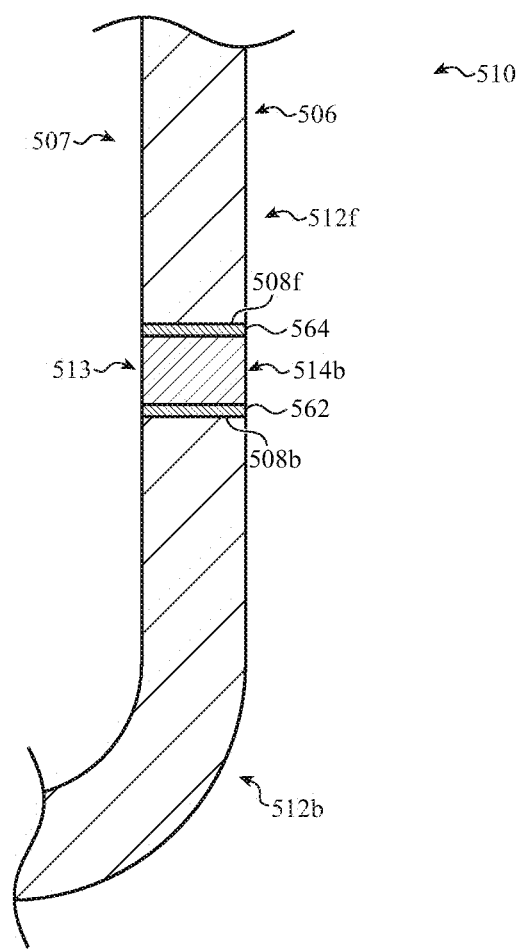
FIG. 5 shows a partial cross-sectional view of another electronic device housing.

As shown in FIG. 2, the housing element 213 extends over the interior surface portion 207b and the interlock region 262 extends along the interior surface portion 207b. The housing element 213 also extends over the interior surface portion 207f and the interlock region 264 extends along the interior surface portion 207f. The portion of the housing element 213 extending over the interior surface portions 207b and 207f can provide additional area for bonding the housing element 213 to the metal housing members 212b and 212f. In additional examples the housing member including the polymer material can extend over interior surface portions defined by the metal housing members to a greater extent than shown in FIG. 2 and, in some cases, may define multiple spacer elements as shown in FIG. 7. In further examples, the housing member may extend over interior surface portions defined by the metal housing members to a lesser extent than shown in FIG. 2 and, in some cases, may be largely confined to the gap between metal housing members as shown in the example of FIG. 5.

The housing member 213 including a polymer material and the spacer element 214b may be formed of the same material, which may be a polymer material or a polymer composite material as previously discussed. The spacer element 214b and the housing member 213 may be similar in composition, physical properties, electrical properties and other properties to the housing member including a polymer material and the spacer elements (e.g., 114b) described with respect to FIGS. 1A and 1B. The metal housing members 212b and 212f may be similar in composition, physical properties, electrical properties and other properties to the metal housing members (e.g., 112b and 112f) shown and described with respect to FIGS. 1A and 1B or may be similar to the metal housing members described with respect to FIG. 6.

FIG. 3 shows an enlarged cross-sectional view of an electronic device housing. The housing 310 may be example of the detail region C-C of the housing 210 in FIG. 2. FIG. 3 shows an enlarged view of a spacer element 314b, an interlock region 362, and a metal housing member 312b. The spacer element 314b is bonded to the metal housing member 312b through the interlock region 362. The depiction of the interlock region 362 in FIG. 3 has been simplified for convenience of illustration.

Figure 8:
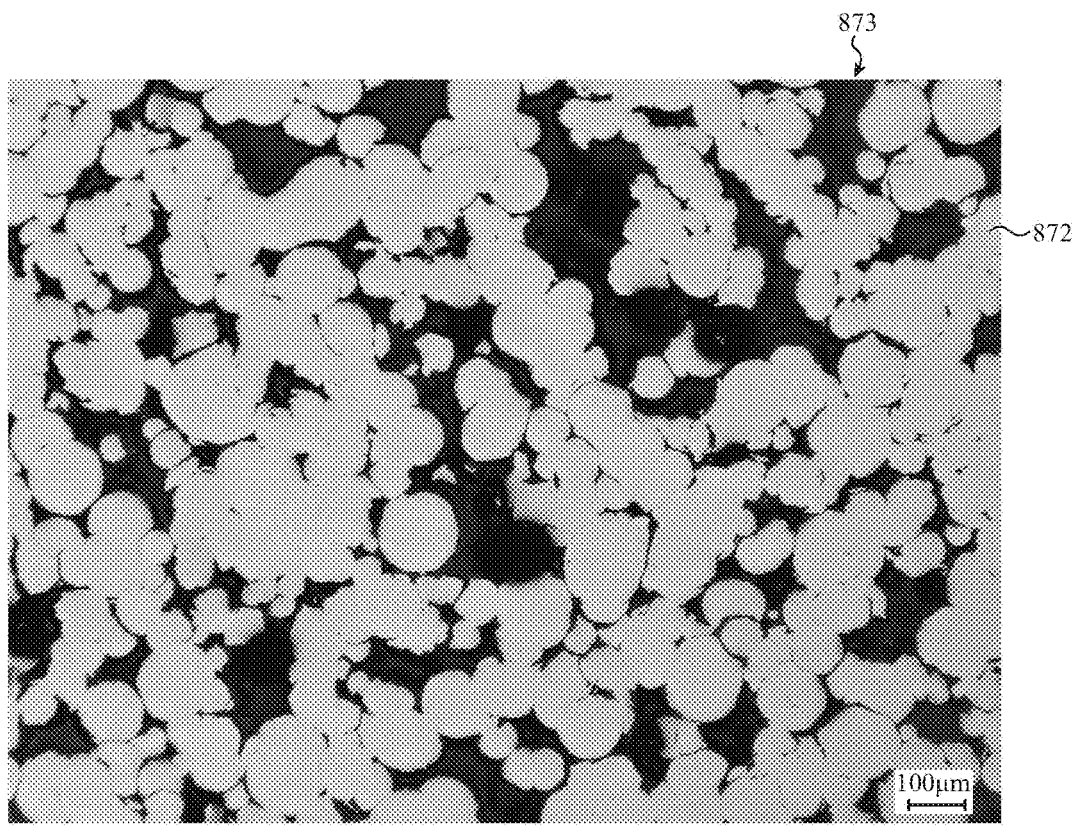
FIG. 8 shows a partial cross-sectional view of a porous metallic layer.
Figure 9:
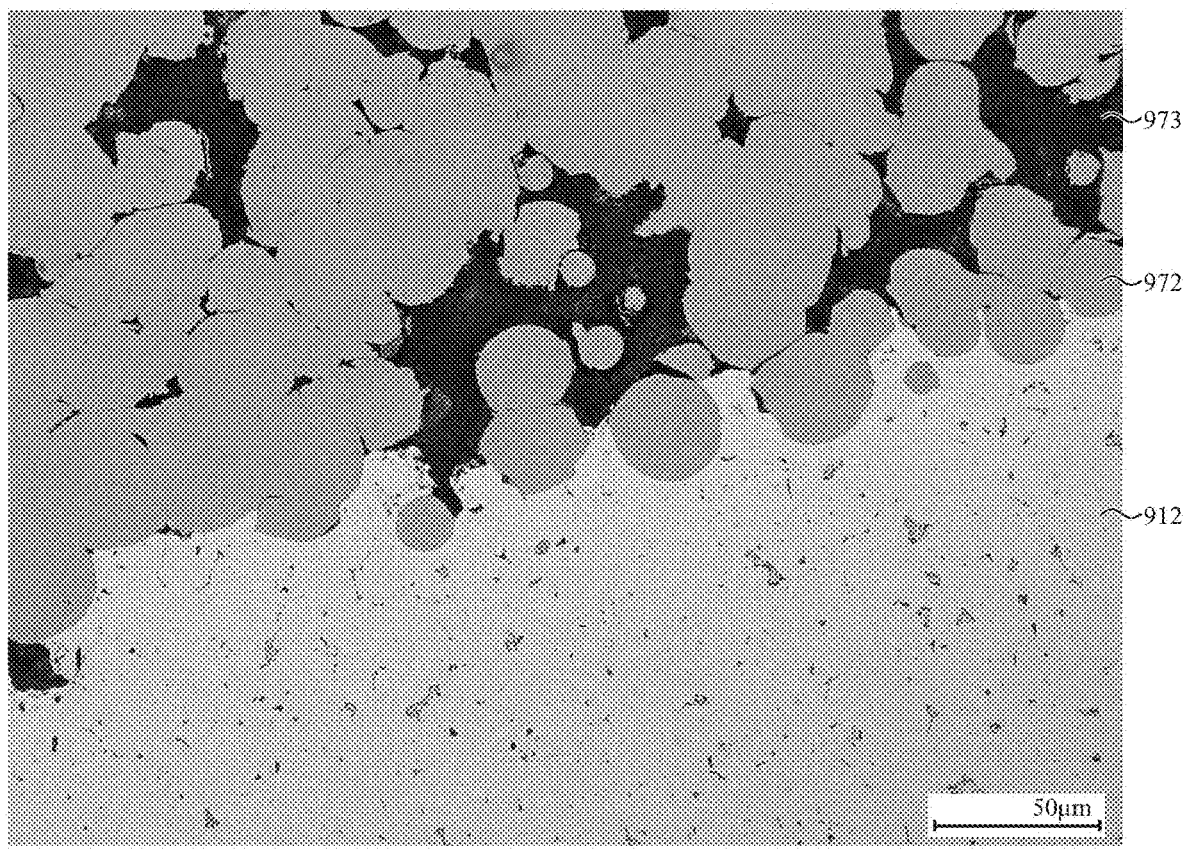
FIG. 9 shows a partial cross-sectional view of another porous metallic layer

The interlock region 362 of FIG. 3 includes a porous metallic layer 372. As previously described, the porous metallic layer 372 may define a network of interconnected pores, which may also be referred to herein as a set of interconnected pores. Phrased differently, the pore space within the porous metallic layer may be interconnected to allow flow of the polymer or polymer composite material between different regions of the pore space. The region of the pore space visible in the cross-section of FIG. 3 may be connected to other regions of the pore space which extend forward and/or behind the plane of FIG. 3. Although the depiction of the porous metallic layer 372 in FIG. 3 has been simplified for convenience of illustration, FIGS. 8 and 9 provide more detailed depictions of porous metallic layers.

As shown in FIG. 3, the polymer material or polymer composite material of the spacer element 314b extends into the pore network and mechanically interlocks with the metallic material that defines the pore network. At least some portions of the polymer or polymer composite material may extend to a depth greater than or equal to half the thickness of porous metallic layer and in some cases may extend to a depth equal to the thickness of the porous metallic layer. The depth may be measured as the distance between the interface of the porous metallic layer with the spacer member and the infiltration front of the polymer material. In some cases, the polymer material fills a substantial entirety of the pore space within the porous metallic layer, such as greater than or equal to 75%, greater than or equal to 80%, or greater than or equal to 90% by volume of the pore space.

Typically, at least some of the pores of the porous metallic layer have an opening size that allows the molten polymer material to flow into the pore network. For example, the pores may be sized to allow a molten thermoplastic polymer material or a molten thermoplastic polymer composite material to flow into the pore network during a molding process. In some cases, the pore network includes pores having an effective size (e.g., a diameter) in the range from 20 micrometers to 100 micrometers. In some cases, the pore network has an average pore size (e.g., an average pore diameter or an average pore throat diameter) from 20 micrometers to 100 micrometers. In some examples, an effective pore and/or average size may be determined from analysis of images of the porous metallic layer (e.g., as measured from a cross-section of the porous metallic layer).

The density or porosity of the porous metallic layer may be controlled to promote formation of an interconnected pore network while maintaining structural integrity of the porous metallic layer. For example, the porosity of the metallic layer may range from 30% to 70% or from 40% to 60% by volume. This porosity may be an average value. In some embodiments, the porosity of the metallic layer is sufficiently uniform to produce a desired uniformity of the interlock strength. For example, the porosity may be generally uniform over a length scale of 500 microns or 1 mm. The porous metallic layer may have a thickness sufficient to accommodate a network of interconnected pores, such as a thickness from 50 micrometers to less than 1 mm or a thickness from 100 micrometers to 500 micrometers. In some examples, the porosity may be determined from analysis of images of the porous metallic layer.

In some embodiments, the porous metallic layer 372 may be formed from metal particles that have been partially consolidated. The porous metallic layer 372 may be formed from metal particles using process that provides structural integrity to the porous metallic layer. For example, the process may be a cold spray process that accelerates the metal particles to a supersonic speed. In some examples, the metal particles have a size ranging from 25 micrometers to 200 micrometers, from 50 micrometers to 150 micrometers, from 100 micrometers to 200 micrometers, from 75 micrometers to 200 micrometers, or from 100 micrometers to 150 micrometers. In some cases, the metal particles provided to the layer-forming process may include a thin layer of a native oxide and small amounts of this native oxide layer may be included in the porous metallic layer. However, the porous metallic layer may be predominately made up from a metal material (e.g., greater than 90% of the metal material). As previously described with respect to FIGS. 1A and 1B, the metal material used to form the metal particles may be the same metal material used to form the metal housing members or may be different.

In some cases, the metal particles are bonded to each other and to the metal housing member. The metal particles may be directly bonded to each other and to the housing member, rather than bonded through use of an intermediate material such as an adhesive material. The bonding between the metal particles and between the metal particles and the metal housing member may be due at least in part to mechanical interlocking. In some cases, the kinetic energy of the spraying operation can cause some fusion between the particles and/or between the particles and the metal housing member. Metallurgical bonding (a form of chemical bonding) can also contribute to the bonding between the metal particles and/or the metal particles and the metal housing member (e.g., due to fusion and/or disruption of native oxide layers on the metal particles and/or the metal housing members as described above). In some embodiments, a cold spray process can produce bonding of the metal particles to each other and to the metal housing member. The cold spray process can produce deformation of the metal particles and/or the impact surface of the metal housing member, which in turn can lead to mechanical interlocking and/or metallurgical bonding.

As shown in FIG. 3, the porous metallic layer 372 is partially embedded in the metal housing member 312b. When the porous metal layer 372 is formed using a cold spray process, the impact of the metal particles on an interior surface of the metal housing member may at least partially embed some of these metal particles in a surface region of the metal housing member. The surface of the metal housing member at an interface with the porous metallic member may therefore include microscale irregularities and may not be completely planar following deposition of the metal particles.

The metal housing member 312b may be similar in composition, physical properties, electrical properties and other properties to the metal housing members (e.g., 112b and 112f) shown and described with respect to FIGS. 1A and 1B. The spacer element 314b may be similar in composition, physical properties, electrical properties and other properties to the housing member including a polymer material and the spacer elements (e.g., 114b) described with respect to FIGS. 1A and 1B. Therefore, that description is not repeated here.

Figure 4:
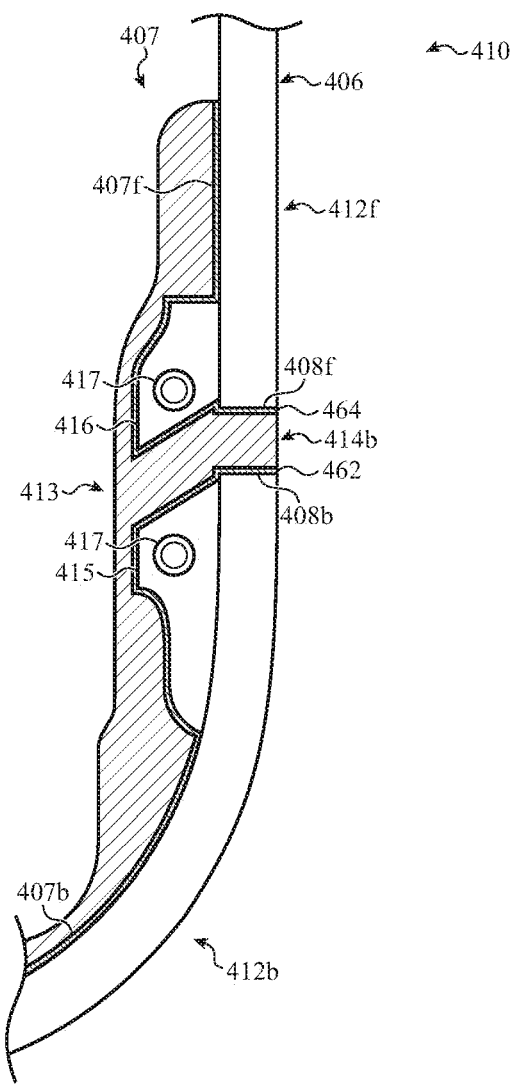
FIG. 4 shows a partial cross-sectional view of another electronic device housing.

FIG. 4 shows a partial cross-section view of another electronic device housing. The housing 410 may be an example of the housing 110 of FIGS. 1A and 1B and the cross-section through the housing 410 may be an example of a lateral cross-section through the housing 110 along A-A in FIG. 1A. The housing 410 defines an interior surface 407 and an exterior surface 406. The exterior surface 406 of the housing may define an exterior surface, such as a side surface, of the electronic device.

The housing 410 includes two metal housing members 412b and 412f and another housing member 413 that includes a polymer material. In the example of FIG. 4, the housing member 412b includes an interlock feature 415 and the housing member 412f includes an interlock feature 416. In the example of FIG. 4, each of the interlock features 415 and 416 protrude with respect to the interior surface portions 407b and 407f of the metal housing members 412b and 412f. The interlock features 415 and 416 may be integrally formed with the metal housing members 412b and 412f. The shape of the interlock features 415 and 416 shown in FIG. 4 is exemplary rather than limiting and in additional examples, an interlock feature may define a hole or channel into which the polymer material or polymer composite material of the housing member 413 may flow.

As previously discussed, the housing member 413 may be formed of a polymer material or a polymer composite material and in some cases may be a dielectric housing member. The housing member 413 defines a spacer element 414b that is positioned between the metal housing members 412b and 412f. The housing member 413 also extends over the interlock features 415 and 416 and along the interior surface portions 407b and 407f. The "overflow" of the housing member 413 over the interlock features 415 and 416 can provide additional mechanical interlocking between the housing member 413 and the metal housing members 412b and 412f. In the example of FIG. 4, bosses 417 on the interlock features 415 and 416 are not covered by the housing member 413, which may allow an electrical connection to be made between one or more of the metal housing members 412b and 412f and an internal component of the electronic device. As previously described with respect to FIG. 2, the interior surface portions 407b and 407f can provide additional area for bonding the housing element 413 to the metal housing members 412b and 412f.

The housing 410 also includes interlock regions 462 and 264. Each of the interlock regions 462 and 464 includes a porous metallic layer and portions of the spacer element 414b that extend into pores of the porous metallic layer, as previously shown and described with respect to the detail view of FIG. 3. Another portion of the spacer element 414b is positioned between the interlock regions 462 and 464. In the example of FIG. 4, the interlock region is shown as extending along the facing surface portions 408b and 408f. However, this example is not limiting and in additional examples the interlock region may also extend along one or more of the interlock features 415 and 416 and/or along a portion of the interior surface portions 407b and/or 407f was previously shown in FIG. 2.

The spacer element 414b and the housing member 413 may be similar in composition, physical properties, electrical properties and other properties to the housing member including a polymer material and the spacer elements (e.g., 114b) described with respect to FIGS. 1A and 1B. The metal housing members 412b and 412f may be similar in composition, physical properties, electrical properties and other properties to the metal housing members (e.g., 112b and 112f) shown and described with respect to FIGS. 1A and 1B or may be similar to the metal housing members described with respect to FIG. 6. The interlock regions 462 and 464 may be similar in composition and physical properties to the interlock region 362 shown and described with respect to FIG. 3.

FIG. 5 shows a partial cross-section view of another electronic device housing. The housing 510 may be an example of the housing 110 of FIGS. 1A and 1B and the cross-section through the housing 510 may be an example of a lateral cross-section through the housing 110 along A-A in FIG. 1A. The housing 510 defines an interior surface 507 and an exterior surface 506. The exterior surface 506 of the housing may define an exterior surface, such as a side surface, of the electronic device.

The housing 510 includes two metal housing members 512b and 512f and another housing member 513 that includes a polymer material. As previously discussed, the housing member 513 may be formed of a polymer material or a polymer composite material and in some cases may be a dielectric housing member. The housing member 513 defines a spacer element 514b that is positioned between the metal housing members 512b and 512f. In the example of FIG. 5, the housing member 513 does not extend appreciably along interior surface portions of the metal housing members 512b and 512f.

The housing 510 also includes interlock regions 562 and 564 that respectively extend along the facing surface portions 508b and 508f. Each of the interlock regions 562 and 564 includes a porous metallic layer and portions of the spacer element 514b that extend into pores of the porous metallic layer, as previously shown and described with respect to the detail view of FIG. 3. Another portion of the spacer element 514b is positioned between the interlock regions 562 and 564. In the example of FIG. 5, the bonding between the spacer element 514b and the metal housing members 512b and 512f may be strong enough that additional bonding between the housing member 513 and internal surfaces and/or interlock features of the metal housing members 512b and 512f is not required.

The spacer element 514b and the housing member 513 may be similar in composition, physical properties, electrical properties and other properties to the housing member including a polymer material and the spacer elements (e.g., 114b) described with respect to FIGS. 1A and 1B. The metal housing members 512b and 512f may be similar in composition, physical properties, electrical properties and other properties to the metal housing members (e.g., 112b and 112f) shown and described with respect to FIGS. 1A and 1B or may be similar to the metal housing members described with respect to FIG. 6. The interlock regions 562 and 564 may be similar in composition and physical properties to the interlock region 362 shown and described with respect to FIG. 3.

Figure 6:
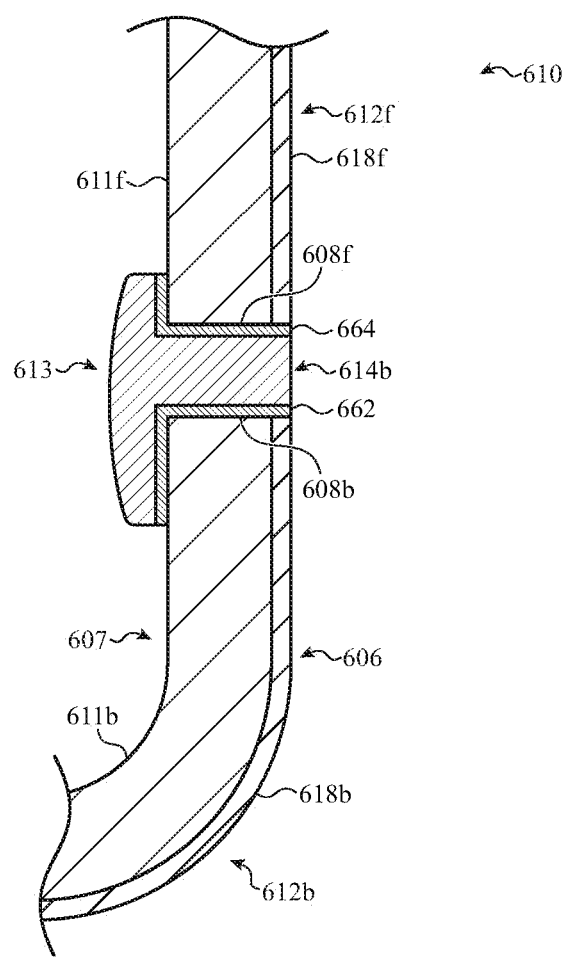
FIG. 6 shows a partial cross-sectional view of another electronic device housing.
Figure 7:
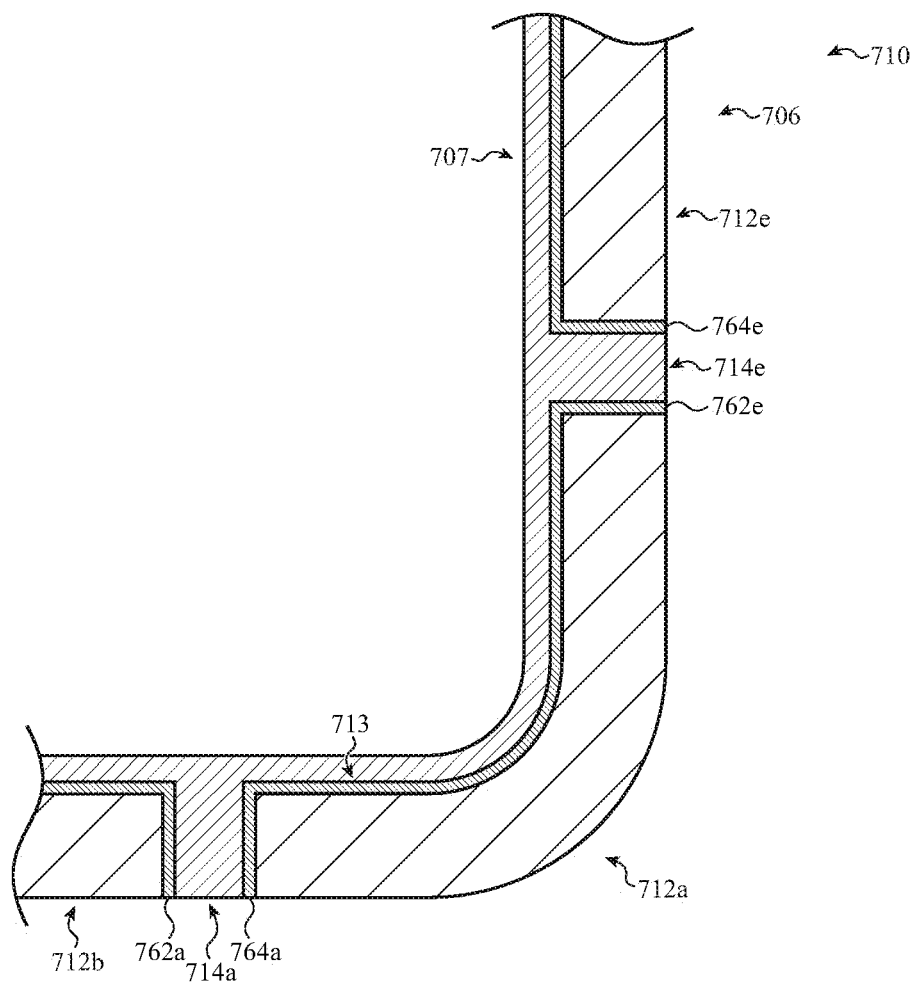
FIG. 7 shows a partial cross-sectional view of another electronic device housing.

FIG. 6 shows a partial cross-section view of another electronic device housing. The housing 610 may be an example of the housing 110 of FIGS. 1A and 1B and the cross-section through the housing 610 may be an example of a lateral cross-section through the housing 110 along A-A in FIG. 1A. The housing 610 defines an interior surface 607 and an exterior surface 606. The exterior surface 606 of the housing may define an exterior surface, such as a side surface, of the electronic device.

The housing 610 includes two metal housing members 612b and 612f and another housing member 613 that includes a polymer material. In the example of FIG. 6, each of the metal housing members 612b and 612f has a core shell structure. For example, the housing member 612b includes a core layer 611b and a shell layer 618b and the housing member 612f includes a core layer 611f and a shell layer 618f. A shell layer may define an exterior surface portion of a metal housing member (and of the housing) (e.g., a portion of the exterior surface 606). A shell layer may also define a first region of a first portion of interior surface that extends from the exterior surface towards the interior of the housing (e.g., a first region of the interior surface portion 608b or 608f). A core layer may define a second region of the first portion of the interior surface (e.g., a second region of the interior surface portion 608b or 608f). The core layer may also define a second portion of the interior surface (e.g., a portion of the interior surface 607). In some embodiments, the core layers 611b and 611f are formed from a different metal material than the shell layers 618b and 618f. For example, the metal material used to form the core layer may be selected for ease of machining (as compared to the shell layer) and in some cases may be an aluminum alloy or a magnesium alloy. The metal material used to form the shell layer may be selected for increased strength and durability (as compared to the core layer) and in some cases may be a titanium, a titanium alloy, or steel (e.g., stainless steel). The shell layer may be joined to the core layer via a cladding operation. The shell layer may be thinner than the core layer as shown in FIG. 6. In additional examples, the ratio of the shell thickness to the core thickness may be greater or less than that shown in FIG. 6. In some cases, a thickness of the core layer is at least 10% or 25% greater than a thickness of the shell layer.

As previously discussed, the housing member 613 may be formed of a polymer material or a polymer composite material and in some cases may be a dielectric housing member. The housing member 613 defines a spacer element 614b that is positioned between the metal housing members 612b and 612f. The housing member 613 also extends along the interior surface portions of the housing members 612b and 612f. As previously discussed with respect to FIG. 2, the "overflow" of the housing member 613 over the interior surface portions defined by the housing members 612b and 612f can produce additional mechanical interlocking between the housing member 613 and the metal housing members 612b and 612f.

The housing 610 also includes interlock regions 662 and 664. Each of the interlock regions 662 and 664 includes a porous metallic layer and portions of the spacer element 614b that extend into pores of the porous metallic layer, as previously shown and described with respect to the detail view of FIG. 3. The metal material used to form the porous metallic layer may be compatible with both the core layer and the shell layer of the metal housing member (e.g., core layers 611b and 611f and shell layers 618b and 618f). For example, when the core layer is formed of an aluminum alloy and the shell layer is formed of a titanium alloy, the porous metallic layer may be formed of titanium or a titanium alloy. In some cases, the porous metallic layer may be formed from the same titanium alloy as the shell layer or may be formed from another titanium alloy having a different chemical composition.

Another portion of the spacer element 614b is positioned between the interlock regions 662 and 664. In the example of FIG. 6, the interlock regions 662 and 664 are shown as extending along the facing surface portions 608b and 608f and as extending along portions of the interior surface 607. However, in other examples, the interlock regions need not extend along the interior surface 607 as was shown in FIG. 5. In further examples, the metal housing members 612b and 612f may define interlock features along the interior surface 607, such as those shown in FIG. 4, and the interlock regions may or may not extend along these interlock features.

The spacer element 614b and the housing member 613 may be similar in composition, physical properties, electrical properties and other properties to the housing member including a polymer material and the spacer elements (e.g., 114b) described with respect to FIGS. 1A and 1B. The metal housing members 612b and 612f may be similar in electrical properties and other properties to the metal housing members (e.g., 112b and 112f) shown and described with respect to FIGS. 1A and 1B. The interlock regions 662 and 664 may be similar in composition and physical properties to the interlock region 362 shown and described with respect to FIG. 3.

FIG. 7 shows a partial cross-section view of another electronic device housing. The housing 710 may be an example of the housing 110 of FIGS. 1A and 1B and the cross-section through the housing 710 may be an example of a lateral cross-section through the housing 110 along B-B in FIG. 1B. The housing 710 defines an interior surface 707 and an exterior surface 706. The exterior surface 706 of the housing may define an exterior surface, such as a side surface, of the electronic device.

The housing 710 includes three metal housing members 712a, 712b, and 712e and another housing member 713 that includes a polymer material. As previously discussed, the housing member 713 may be formed of a polymer material or a polymer composite material and in some cases may be a dielectric housing member. The housing member 713 defines spacer elements 714a and 714e. The spacer element 714a is positioned between the metal housing members 712a and 712b. The spacer element 714e is positioned between the metal housing members 712a and 712e. The housing member 713 also extends over the interior surface portions defined by the metal housing members 712a, 712b, and 712e, which can provide additional area for bonding the housing element 713 to the metal housing members.

The housing 710 also includes interlock regions 762a, 762e, 764a, and 764e. Each of the interlock regions 762a, 762e, 764a, and 764e includes a porous metallic layer and respective portions of the spacer elements 714a and 714e that extend into pores of the porous metallic layer, as previously shown and described with respect to the detail view of FIG. 3. Other portions of the spacer elements 714a and 714e are positioned between the interlock regions 762a and 764a and 762e and 764e. In the example of FIG. 7, the interlock region is shown as extending along the facing surface portions of the metal housing members 712a, 712b, and 712e and as extending along at least a portion of the interior surface portions defined by the metal housing members 712a, 712b, and 712e. In further examples, the metal housing members 712a, 712b, and 712e may define interlock features, similar to those shown in FIG. 4, and the interlock regions may or may not extend along these interlock features.

The spacer elements 714a and 714e and the housing member 713 may be similar in composition, physical properties, electrical properties and other properties to the housing member including a polymer material and the spacer elements (e.g., 114b) described with respect to FIGS. 1A and 1B. The metal housing members 712a, 712b, and 712e may be similar in composition, physical properties, electrical properties and other properties to the metal housing members (e.g., 112b and 1120 shown and described with respect to FIGS. 1A and 1B or may be similar to the metal housing members described with respect to FIG. 6. The interlock regions 762a, 762e, 764a, and 764e may be similar in composition and physical properties to the interlock region 362 shown and described with respect to FIG. 3.

FIG. 8 shows a partial cross-sectional view of a porous metallic layer. The metallic layer 872 defines a network of interconnected pores 873. The porous metallic layer shown in FIG. 8 was formed from metal particles using a cold spray process. As shown in FIG. 8, at least some of the metal particles have been deformed and bonded together during the cold spray process. The underlying substrate is not shown in the image of FIG. 8. The pores 873 were filled with a polymer material for purposes of preparing the cross-section. The scale marker corresponds to a distance of 100 micrometers.

FIG. 9 shows a partial cross-sectional view of another porous metallic layer. The metallic layer 972 defines a network of interconnected pores 973. The porous metallic layer shown in FIG. 9 was formed from metal particles using a cold spray process. As shown in FIG. 9, at least some of the metal particles have been deformed and bonded together during the cold spray process. The underlying metal substrate 912 has also been deformed during the cold spray process, so that some of the metal particles in the metallic layer 972 are partially embedded in the metal substrate 912. The pores 973 have been filled with a polymer material for purposes of preparing the cross-section. The scale marker corresponds to a distance of 50 micrometers.

FIG. 10 shows a block diagram of an example electronic device. The schematic representation depicted in FIG. 10 may correspond to components of the electronic devices depicted in FIGS. 1A and 1B as described above. However, FIG. 10 may also more generally represent other types of electronic devices including a biometric input system as described herein.

In embodiments, an electronic device 1000 may include sensors 1020 to provide information regarding configuration and/or orientation of the electronic device in order to control the output of the display. For example, a portion of the display 1008 may be turned off, disabled, or put in a low energy state when all or part of the viewable area of the display 1008 is blocked or substantially obscured. As another example, the display 1008 may be adapted to rotate the display of graphical output based on changes in orientation of the device 1000 (e.g., 90 degrees or 180 degrees) in response to the device 1000 being rotated.

The electronic device 1000 also includes a processor 1006 operably connected with a computer-readable memory 1002. The processor 1006 may be operatively connected to the memory 1002 component via an electronic bus or bridge. The processor 1006 may be implemented as one or more computer processors or microcontrollers configured to perform operations in response to computer-readable instructions. The processor 1006 may include a central processing unit (CPU) of the device 1000. Additionally, and/or alternatively, the processor 1006 may include other electronic circuitry within the device 1000 including application specific integrated chips (ASIC) and other microcontroller devices. The processor 1006 may be configured to perform functionality described in the examples above.

The memory 1002 may include a variety of types of non-transitory computer-readable storage media, including, for example, read access memory (RAM), read-only memory (ROM), erasable programmable memory (e.g., EPROM and EEPROM), or flash memory. The memory 1002 is configured to store computer-readable instructions, sensor values, and other persistent software elements.

The electronic device 1000 may include control circuitry 1010. The control circuitry 1010 may be implemented in a single control unit and not necessarily as distinct electrical circuit elements. As used herein, "control unit" will be used synonymously with "control circuitry." The control circuitry 1010 may receive signals from the processor 1006 or from other elements of the electronic device 1000.

As shown in FIG. 10, the electronic device 1000 includes a battery 1014 that is configured to provide electrical power to the components of the electronic device 1000. The battery 1014 may include one or more power storage cells that are linked together to provide an internal supply of electrical power. The battery 1014 may be operatively coupled to power management circuitry that is configured to provide appropriate voltage and power levels for individual components or groups of components within the electronic device 1000. The battery 1014, via power management circuitry, may be configured to receive power from an external source, such as an alternating current power outlet. The battery 1014 may store received power so that the electronic device 1000 may operate without connection to an external power source for an extended period of time, which may range from several hours to several days.

In some embodiments, the electronic device 1000 includes one or more input devices 1018. The input device 1018 is a device that is configured to receive input from a user or the environment. The input device 1018 may include, for example, a push button, a touch-activated button, a capacitive touch sensor, a touch screen (e.g., a touch-sensitive display or a force-sensitive display), a capacitive touch button, dial, crown, or the like. In some embodiments, the input device 1018 may provide a dedicated or primary function, including, for example, a power button, volume buttons, home buttons, scroll wheels, and camera buttons.

The device 1000 may also include one or more sensors or sensor components 1020, such as a force sensor, a capacitive sensor, an accelerometer, a barometer, a gyroscope, a proximity sensor, a light sensor, or the like. In some cases, the device 1000 includes a sensor array (also referred to as a sensing array) which includes multiple sensors 1020. For example, a sensor array associated with a protruding feature of a cover member may include an ambient light sensor, a Lidar sensor, and a microphone. As previously discussed with respect to FIG. 1B, one or more camera components may also be associated with the protruding feature. The sensors 1020 may be operably coupled to processing circuitry. In some embodiments, the sensors 1020 may detect deformation and/or changes in configuration of the electronic device and be operably coupled to processing circuitry that controls the display based on the sensor signals. In some implementations, output from the sensors 1020 is used to reconfigure the display output to correspond to an orientation or folded/unfolded configuration or state of the device. Example sensors 1020 for this purpose include accelerometers, gyroscopes, magnetometers, and other similar types of position/orientation sensing devices. In addition, the sensors 1020 may include a microphone, an acoustic sensor, a light sensor (including ambient light, infrared (IR) light, ultraviolet (UV) light), an optical facial recognition sensor, a depth measuring sensor (e.g., a time of flight sensor), a health monitoring sensor (e.g., an electrocardiogram (ecg) sensor, a heart rate sensor, a photoplethysmogram (ppg) sensor, a pulse oximeter, a biometric sensor (e.g., a fingerprint sensor), or other types of sensing device.

In some embodiments, the electronic device 1000 includes one or more output devices 1004 configured to provide output to a user. The output device 1004 may include a display 1008 that renders visual information generated by the processor 1006. The output device 1004 may also include one or more speakers to provide audio output. The output device 1004 may also include one or more haptic devices that are configured to produce a haptic or tactile output along an exterior surface of the device 1000.

The display 1008 may include a liquid-crystal display (LCD), a light-emitting diode (LED) display, an LED-backlit LCD display, an organic light-emitting diode (OLED) display, an active layer organic light-emitting diode (AMOLED) display, an organic electroluminescent (EL) display, an electrophoretic ink display, or the like. If the display 1008 is a liquid-crystal display or an electrophoretic ink display, the display 1008 may also include a backlight component that can be controlled to provide variable levels of display brightness. If the display 1008 is an organic light-emitting diode or an organic electroluminescent-type display, the brightness of the display 1008 may be controlled by modifying the electrical signals that are provided to display elements. In addition, information regarding configuration and/or orientation of the electronic device may be used to control the output of the display as described with respect to input devices 1018. In some cases, the display is integrated with a touch and/or force sensor in order to detect touches and/or forces applied along an exterior surface of the device 1000.

The electronic device 1000 may also include a communication port 1012 that is configured to transmit and/or receive signals or electrical communication from an external or separate device. The communication port 1012 may be configured to couple to an external device via a cable, adaptor, or other type of electrical connector. In some embodiments, the communication port 1012 may be used to couple the electronic device 1000 to a host computer.

The electronic device 1000 may also include at least one accessory 1016, such as a camera, a flash for the camera, or other such device. The camera may be part of a camera array or sensing array that may be connected to other parts of the electronic device 1000 such as the control circuitry 1010.

As used herein, the terms "about," "approximately," "substantially," "similar," and the like are used to account for relatively small variations, such as a variation of +/−10%, +/−5%, +/−2%, or +/−1%. In addition, use of the term "about" in reference to the endpoint of a range may signify a variation of +/−10%, +/−5%, +/−2%, or +/−1% of the endpoint value. In addition, disclosure of a range in which at least one endpoint is described as being "about" a specified value includes disclosure of the range in which the endpoint is equal to the specified value.

As used herein, the phrase "one or more of" or "at least one of" or "preceding a series of items, with the term "and" or "or" to separate any of the items, modifies the list as a whole, rather than each member of the list. The phrase "one or more of" or "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "one or more of A, B, and C" or "one or more of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

The following discussion applies to the electronic devices described herein to the extent that these devices may be used to obtain personally identifiable information data. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device comprising:
a display; and
an enclosure defining an internal cavity and including:
   a housing comprising:
      a first metal housing member defining a first portion of an exterior surface of the housing;
      a first metallic coating defining a first pore network and disposed along an interior surface of the first metal housing member;
      a second metal housing member defining a second portion of the exterior surface of the housing;
      a second metallic coating defining a second pore network and disposed along an interior surface of the second metal housing member; and
      a dielectric member defining a third portion of the exterior surface of the housing and extending into pores of the first pore network and the second pore network; and
   a front cover coupled to the housing and defining a transparent window positioned over the display.

2. The electronic device of claim 1, wherein:
the electronic device includes wireless communication circuitry within the internal cavity;
the first metal housing member is operably coupled to the wireless communication circuitry; and
each of the first metallic coating and the second metallic coating has an average porosity that ranges from 30% to 70% by volume.

3. The electronic device of claim 2, wherein each of the first metallic coating and the second metallic coating is formed from metal particles that are bonded together.

4. The electronic device of claim 2, wherein:
each of the first metal housing member and the second metal housing member is formed from a first titanium-based material; and
each of the first metallic coating and the second metallic coating is formed from a second titanium-based material.

5. The electronic device of claim 2, wherein each of the first pore network and the second pore network has an average pore diameter in a range from 20 micrometers to 100 micrometers.

6. The electronic device of claim 5, wherein:
the dielectric member is formed from a polymer composite comprising a thermoplastic polymer material and discontinuous fibers dispersed in the thermoplastic polymer material; and
at least some of the fibers have a width less than the average pore diameter of each of the first pore network and the second pore network.

7. The electronic device of claim 1, wherein the electronic device further comprises a rear cover coupled to the housing and positioned over a wireless charging component.

8. An electronic device comprising:
an enclosure defining an internal cavity and including:
   a first enclosure structure comprising:
      a first metal enclosure member defining a first portion of an exterior surface of the enclosure; and
      a first metallic coating bonded to an interior surface of the first metal enclosure member and defining a first set of interconnected pores;
   a second enclosure structure comprising:
      a second metal enclosure member defining a second portion of the exterior surface of the enclosure; and
      a second metallic coating bonded to an interior surface of the second metal enclosure member and defining a second set of interconnected pores; and
   a dielectric member defining a third portion of the exterior surface of the enclosure and extending into each of the first and the second sets of interconnected pores; and
sensor circuitry positioned within the internal cavity and operatively coupled to the first metal enclosure member.

9. The electronic device of claim 8, wherein:
each of the first metallic coating and the second metallic coating has a thickness in a range from 50 micrometers to less than 1 millimeter;
a first depth of the dielectric member within the first set of interconnected pores is greater or equal to half the thickness of the first metallic coating; and
a second depth of the dielectric member within the second set of interconnected pores is greater or equal to half the thickness of the second metallic coating.

10. The electronic device of claim 8, wherein:
the first metallic coating is partially embedded in the first metal enclosure member; and
the second metallic coating is partially embedded in the second metal enclosure member.

11. The electronic device of claim 8, wherein:
the interior surface of the first metal enclosure member comprises:
   a first portion that extends inward from the first portion of the exterior surface of the enclosure; and
   a second portion that is opposite the first portion of the exterior surface of the enclosure;
the interior surface of the second metal enclosure member comprises:
   a first portion that extends inward from the second portion of the exterior surface of the enclosure; and
   a second portion that is opposite the second portion of the exterior surface of the enclosure; and
the dielectric member extends over the first and the second portions of the interior surface of the first metal enclosure member and the first and the second portions of the interior surface of the second metal enclosure member.

12. The electronic device of claim 11, wherein:
a third portion of the interior surface of the first metal enclosure member partially defines an interlock feature; and
the dielectric member extends over the third portion of the interior surface of the first metal enclosure member.

13. The electronic device of claim 11, wherein the first metal enclosure member includes:
- a first layer formed of a titanium alloy, defining the first portion of the exterior surface of the enclosure, and defining a first region of the first portion of the interior surface of the first metal enclosure member; and
- a second layer formed of an aluminum alloy, bonded to the first layer, defining a second region of the first portion of the interior surface of the first metal enclosure member, and defining the second portion of the interior surface of the first metal enclosure member.

14. The electronic device of claim 13, wherein the first metallic coating is formed from a titanium-based material.

15. A housing for an electronic device, the housing comprising:
- a first housing member formed from a first metal material defining a first portion of an exterior surface of the housing;
- a second housing member formed from a second metal material defining a second portion of the exterior surface of the housing;
- a third housing member formed from a polymer-based material defining a third portion of the exterior surface of the housing;
- a first metallic layer bonded to an interior surface of the first housing member and defining a first pore network, a first portion of the polymer-based material of the third housing member extending into the first pore network; and
- a second metallic layer bonded to an interior surface of the second housing member and defining a second pore network, a second portion of the polymer-based material of the third housing member extending into the second pore network.

16. The electronic device of claim 15, wherein the first and the second portions of the polymer-based material of the third housing member fill at least 75% of the first pore network and the second pore network.

17. The electronic device of claim 15, wherein:
the interior surface of the first housing member defines:
- a first portion extending from the first portion of the exterior surface of the housing; and
- a second portion partially defining a first interlock feature;

the interior surface of the second housing member defines:
- a first portion extending from the second portion of the exterior surface of the housing; and
- a second portion partially defining a second interlock feature; and the third housing member extends over the first interlock feature and the second interlock feature.

18. The electronic device of claim 15, wherein the polymer-based material is a thermoplastic polymer material.

19. The electronic device of claim 15, wherein the polymer-based material is a composite material comprising a thermoplastic polymer material and discontinuous silicate glass fibers dispersed in the thermoplastic polymer material.

20. The electronic device of claim 15, wherein:
- the first metallic layer is formed from a third metal material that differs from the first metal material; and
- the second metallic layer is formed from a fourth metal material that differs from the second metal material.

* * * * *